Oct. 26, 1965 D. J. COMER 3,214,710
PHASE AND FREQUENCY MODULATOR CIRCUITS
Filed Aug. 28, 1962 2 Sheets-Sheet 1

INVENTOR.
DAVID J. COMER
BY David M. Koffsky
AGENT

Oct. 26, 1965 D. J. COMER 3,214,710

PHASE AND FREQUENCY MODULATOR CIRCUITS

Filed Aug. 28, 1962 2 Sheets-Sheet 2

3,214,710
PHASE AND FREQUENCY MODULATOR CIRCUITS

David J. Comer, San Jose, Calif., assignor to International Business Machines Corporation, New York, N.Y., a corporation of New York
Filed Aug. 28, 1962, Ser. No. 219,945
8 Claims. (Cl. 332—29)

This invention relates to modulation circuits and more particularly to circuits for phase and frequency modulating a carrier signal.

Of the several relatively simple phase modulation circuits in use at the present time, a limitation common to all of them is that the modulation is linear only if the degree of carrier phase shift never exceeds a certain value. This value for simple circuits lies between 10 and 15 degrees. More complex circuits are required to extend the linear range of phase shift up to approximately 60 degrees.

Frequency modulators, in the form of phase controlled variable frequency oscillators, have much the same problem as those above mentioned for the phase modulators. That is, linear frequency deviations available for changes in modulating voltage are limited unless the phase controllers are made quite complex to achieve the necessary wide linear phase variation.

Accordingly, it is an object of this invention to provide an improved phase modulator.

It is another object of this invention to provide an improved phase modulator of simple design.

Still another object of this invention is to provide an improved phase modulator which maintains simplicity of design while providing a substantially linear wide range phase shift.

It is also an object of this invention to provide an improved frequency modulator which exhibits wide range linear changes in frequency for changes in applied modulating signal.

The above stated objects are attained by first applying to a phase splitter a relatively high frequency carrier signal superimposed upon an amplitude varying modulating signal. The phase splitter produces two signal outputs, one of which is displaced by 180° from the other. One of the signal outputs is fed through a reactive means where it experiences approximately a 90° phase shift. The outher output signal is fed through a resistive device whose resistance varies in an inversely related substantially hyperbolic manner in response to changes in voltage applied thereacross. When the outputs from the resistive means and reactance means are combined, it can be shown that practically a linear phase shift is obtained. Basically, this is so because as the resistance of the resistance means varies in accordance with voltage level variations of the carrier signal, the non-linear resistance changes balance out the non-linearities of the phase shift circuit.

In a frequency modulation embodiment of this invention, phase modulation means of the type described above, which normally exhibit a phase shift of $\theta°$, is provided with a feedback having a phase shift of $360°—\theta°$. The circuit then oscillates at a basic frequency which establishes a 360° phase shift around the the circuit loop. When the phase shift through the phase modulation means is changed by the application of a modulating signal, the frequency of oscillation automatically changes to maintain the required 360° loop phase shift.

The foregoing and other objects, features and advantages of the invention will be apparent from the following more particular description of preferred embodiments of the invention, as illustrated in the accompanying drawings.

Figure 1:
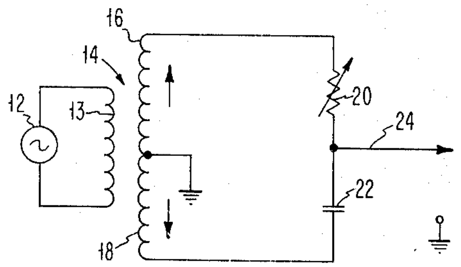
PRIOR ART FIG. 1
FIG. 1 is a circuit diagram of a prior art phase shifter.

In order to gain a better understanding of the subject invention, it is first desirable to analyze the prior art split-phase phase shifter shown in FIG. 1. Oscillator 12 is connected to the primary winding 13 of transformer 14. The secondary windings 16 and 18 of transformer 14 are center-tapped to ground and thereby produe phase-opposed voltage outputs. Connected to the windings 16 and 18 are variable resistor 20 and capacitor 22, respectively. The output from this phase shift circuit is taken between terminal 24 and ground.

Figure 2:
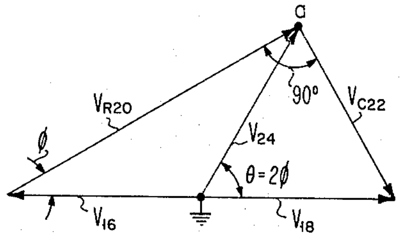
FIG. 2 is a vector diagram showing relative voltage relationships in the circuit of FIG. 1.

In FIG. 2 there is shown a vector diagram which depicts the relationships between the various voltages and phases found in the phase shifter shown in FIG. 1. The voltages appearing across the center tapped secondary windings 16 and 18 of transformer 14 are phase opposed and are respectively represented as $V_{16}$ and $V_{18}$. $V_{R20}$ is the voltage drop across resistor 20 and $V_{C22}$ is the voltage drop across capacitor 22. Since, by Kirchhoff's law, the sum of the voltage drops around the circuit must equal zero, the voltage vector diagram is a closed triangle and the output voltage at terminal 24 is represented by a vector drawn from the ground connection between $V_{16}$ and $V_{18}$ and the right angle intersection between $V_{R20}$ and $V_{C22}$. It can be shown that the phase shift $\theta$ of the output voltage $V_{24}$ (the included angle between $V_{24}$ and $V_{18}$) is twice the included angle between $V_{16}$ and $V_{R20}$. With these relationships in mind, the following equations can be derived from the diagram:

$$\phi=\tan^{-1}\frac{1}{\omega C_{22}R_{20}} \qquad (1)$$

where $\omega=2\pi$.(frequency of oscillator 22)

since $\theta=2\phi$, then $$\theta=2\tan^{-1}\frac{1}{\omega C_{22}R_{20}} \qquad (2)$$

Figure 3:
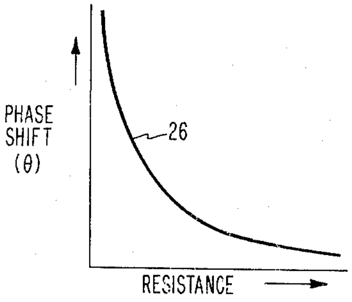
FIG. 3 is a graph showing the variation of circuit phase shift with variations in resistance in the crcuit of FIG. 1.

From Equation (2) it can be seen that the phase shift $\theta$ of the output voltage $V_{24}$ varies as an inverse tangential function of changes in either capacitor 22 or resistor 20 (assuming all frequencies constant). A plot of Equation (2) showing the variation of phase shift $\theta$ as the resistance of $R_{20}$ is varied as shown in FIG. 3 by curve 26. Since curve 26 clearly resembles a hyperbola, it can be approximated by an even simpler expression than Equation (2), i.e., $$\theta=\frac{K_1}{R_{20}} \text{ where } K_1 \text{ is a constant} \qquad (3)$$

From Equation (3) and FIG. 3 it is obvious that for any extended variations of resistance, the phase shift of the circuit shown in FIG. 1 is far from linear.

Assume now that a device is substituted for variable resistor 20 whose variations of resistance are substantially hyperbolic in relation to changes in voltage applied thereacross. A material which experiences the aforementioned resistance variations is "Thyrite" which is described in U.S. Patent 1,822,742 to McEachron. Another device which exhibits this characteristic is a properly biased semiconductor diode. The diode is not so satisfactory as the Thyrite due to the very limited voltage range over which it exhibits the necessary characteristic response.

Figure 4:
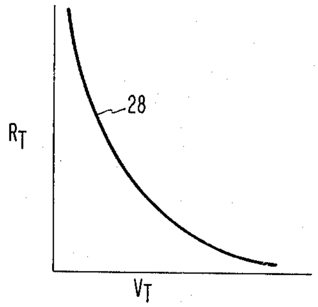
FIG. 4 is a graph depicting the characteristic variations of Thyrite resistance with variations in voltage applied thereto.

The hyperbolic resistance voltage relationship curve 28 as shown in FIG. 2 of the McEachron patent is reproduced in the drawings as FIG. 4. Since curve 28 clearly resembles a hyperbola, the relationship between the voltage across the Thyrite $V_T$ and the resistance of the Thyrite, $R_T$, can be expressed as:

$$R_T=\frac{K_2}{V_T} \text{ where } K_2 \text{ is constant} \tag{4}$$

If this value of $R_T$ is substituted for $R_{20}$ into Equation (3), for phase shift $\theta$, we get $$\theta=\frac{K_1}{R_{20}}=\frac{K_1}{R_T} \tag{5}$$

$$\theta=\frac{K_1}{K_2/V_T}=\frac{K_1V_T}{K_2}=K_3V_T \text{ where } K_3 \text{ is a constant}=\frac{K_1}{K_2}$$

Equation (5) illustrates that the phase shift through a circuit of the type shown in FIG. 1 (where a Thyrite resistor has been substituted for variable resistor 20) will be a substantially linear function of the voltage across the Thyrite. This relationship will hold true so long as the approximations made in the derivations of Equations (3) and (4) hold. From the practical standpoint, these approximations are valid for circuit phase shifts up to 60°.

Figure 5:
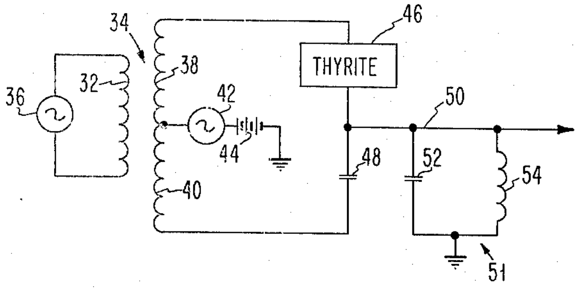
FIG. 5 is a circuit diagram of an embodiment of the invention.

With reference now to FIG. 5, a phase modulation circuit is shown which utilizes the Tryrite phase shift circuit described above. The primary winding 32 of transformer 34 is energized by a carrier oscillator 36. To the center tap between secondary windings 38 and 40, there is applied a source of modulating signals 42 and the output from bias battery 44. Thyrite resistor 46 is connected to winding 38 and forms one-half of the phase modulation circuit. The D.C. current supplied by battery 44 acts to establish the operating point of Thyrite resistor 46. Capacitor 48, which is connected to secondary winding 40, forms the other half of the basic phase modulation circuit (an inductor could also be used). Output conductor 50 which is connected between Thyrite resistor 46 and capacitor 48 also forms a common connection point for tuned circuit 51 which includes capacitor 52 and inductor 54. Tuned circuit 51 is tuned to resonate and thereby provide its highest impedance at the output frequency of carrier oscillator 36.

Figure 6:
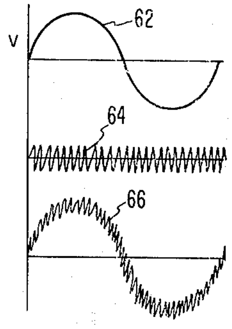
FIG. 6 is a diagram of signals appearing in the circuit of FIG. 5.

The signals which appear across secondary windings 38 and 40 are illustrated in FIG. 6. Modulating signal 62 (a relatively low frequency) is produced by modulating signal source 42 and applied to the center tap between windings 38 and 40. Carrier signal 64 which is induced in secondary windings 38 and 40 by primary winding 32 is a high frequency oscillation generated by carrier oscillator 36.

The resultant output from secondary windings 38 and 40 is shown by wave form 66. From this it can be seen that a superimposition occurs whereby the level of carrier signal 64 is made to vary in accordance with the voltage amplitude variations of modulating signal 62.

In FIG. 5 the superimposed carrier signal 66 is applied to Thyrite resistor 46 and, phase displaced by 180°, to capacitor 48. Since tuned circuit 51 is resonant at the carrier signal frequency, it presents a large impedance thereto and a small impedance to all other frequencies, i.e., the modulating signal frequency. Additionally, operating resistances of Thyrite fall substantially in the range of 1–30K ohms, whereas the impedance of tuned circuit 51 to carrier signal 64 may be made many times these values. Thus, practically the entire voltage drop due to carrier signal 64 appears across tuned circuit 51 while substantially the entire voltage drop due to modulating signal 62 appears across Thyrite resistor 46 (the tuned circuit 51 being a low impedance to ground at this frequency). The impedance of capacitor 48 remains substantially constant throughout the operation of the circuit.

It should now be apparent that the phase displacement of the carrier signal by the phase shifting network at output terminal 50 depends almost entirely upon the voltage level of the modulating signal 62. Thus (see FIG. 2) as the modulating signal increases in voltage amplitude, the resistance of the Thyrite decreases, thereby causing the output voltage vector to rotate counterclockwise, increasing the phase shift $\theta$. Conversely, as the amplitude of the modulating voltage decreases, the resistance of the Thyrite increases and the phase shift is caused to decrease. There is therefore achieved a very simple phase modulator which provides wide linear phase variations in accordance with amplitude variations of a modulating signal.

If it is desired to utilize a carrier signal whose amplitude is small in relation to the amplitude variations of the modulating signal, tuned circuit 51 can be eliminated. This is so because the voltage drop across Thyrite resistor 46 will still be substantially controlled by the amplitude variations of the modulating signal and will be little affected by the carrier signal.

Figure 7:
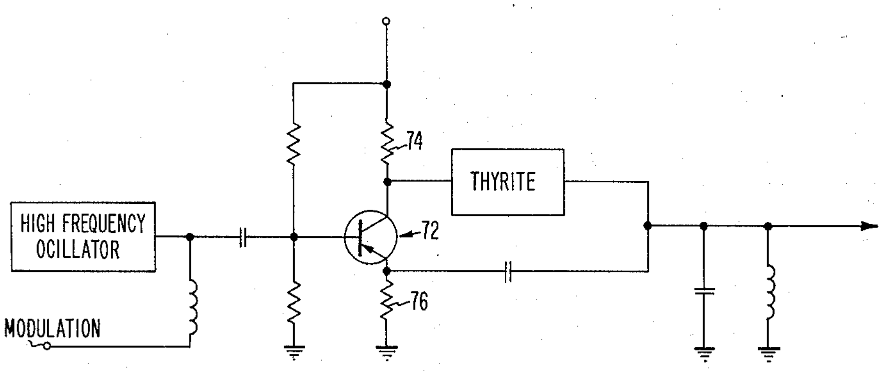
FIG. 7 is a circuit diagram of an embodiment of the invention wherein transistor circuitry is utilized.

In FIG. 7, there is shown an embodiment of the invention wherein a transistor phase splitter is utilized in lieu of the transformer circuit shown in FIG. 5. In this circuit, the carrier signal is superimposed upon the modulating signal and applied to base of transistor 72. As is well known, the voltage which appears across collector resistor 74 will be phase displaced by 180° from the voltage appearing across emitter resistor 76. There is thereby supplied to the Thyrite-capacitor phase shift circuit, the required split-phase superimposed carrier signal.

The phase modulated outputs from the circuits of FIGS. 5 and 7 will have little, if any, amplitude variations. This is due to the fact that the output conductor is essentially at ground potential with respect to the low frequency modulating signal. Therefore, the potential appearing at the output is essentially that produced by the phase shifted carrier signal (a constant amplitude signal) appearing across the tuned circuit.

Figure 8:
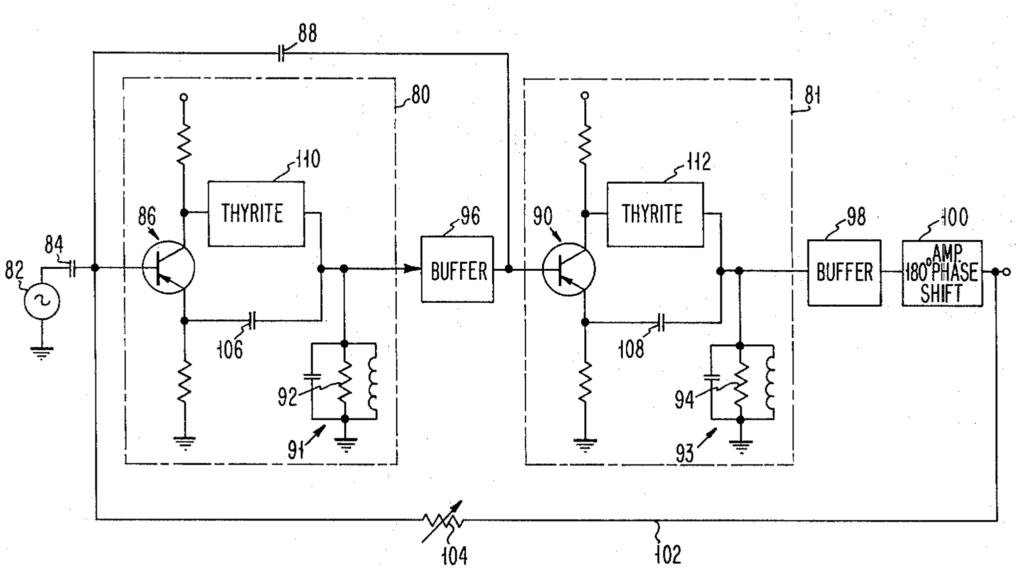
FIG. 8 is a circuit diagram of a frequency modulation circuit which embodies the subject invention.

With reference now to FIG. 8, there is shown a circuit diagram of a frequency modulator which employs the circuit shown in FIG. 7. Modulating signal source 82 applies its output through capacitor 84 to phase shift circuit 80 and through capacitor 88 to phase shift circuit 81. Phase shift circuits 80 and 81, which respectively include transistors 86 and 90 and their associated circuitry, are substantially identical to the phase modulator shown in FIG. 7. For simplicity, the base electrode biasing circuitry is not shown in FIG. 8. The only difference between the phase shift circuits of FIG. 7 and FIG. 8 is that tuned circuits 91 and 93 in each of phase shift circuits 80 and 81 have been shunted by resistors 92 and 94. These resistors are included to lower the Q of these tuned circuits for a purpose to be hereinafter described.

Phase shift circuit 80 is connected through buffer amplifier 96 to the base of transistor 90 in phase shift circuit 81. The output from phase shift circuit 81 is applied through buffer amplifier 98 to a conventional amplifier 100 which introduces a 180° phase shift into a received signal. Buffer amplifiers 96 and 98 are preferably emitter follower or cathode follower amplifiers which isolate and impedance match the various circuits while introducing no phase shift into a signal.

The output from amplifier 100 is fed back via conductor 102 through variable resistor 104 to the base circuit of transistor 86 in phase shift circuit 80. As will hereinafter be seen, the result of this feedback is that the circuit of FIG. 8 oscillates at a frequency which is determined by the amount of phase shift introduced into the circuit loop by phase shift circuits 80 and 81. Since the oscillation frequencies of this circuit are much higher than the operational frequencies of modulating source 82, capacitors 84 and 88, which present small impedances to the lower frequency modulating signal, are included to substantially block the oscillator feedback on line 102 from entering either modulating source 82 or the base circuit of transistor 90.

Regarding the operation of the frequency modulator, reference should be first made to the operation of phase shift circuits 80 and 81. As previously described, the phase shift through a circuit such as is shown in FIG. 7 can be expressed as:

$$\theta = 2\tan^{-1}\frac{1}{\omega C R_T} \quad (6)$$

but, $\omega = 2\pi f$
therefore:

$$\theta = 2\tan^{-1}\frac{1}{2\pi f C R_T}$$

solving for $f$:

$$f = \frac{1}{2\pi f C R_T \tan\frac{\theta}{2}}$$

$$f = \frac{K_4}{R_T \tan\frac{\theta}{2}}$$

where $K_4$=a constant=

$$\frac{1}{2\pi C} \quad (7)$$

Equation (6) indicates that any variation in ($R_T$) or in $$\left(\left(\tan\frac{\theta}{2}\right)\right)$$

results in an inverse variation of the frequency of a signal passing through the phase shifter. But, if oscillations are to be sustained in the frequency modulator, two well-known requirements must be met, i.e., a loop gain of one or greater and a loop phase shift of 360°. Since amplifier 100 introduces a 180° phase shift into the signal, it follows that phase shift circuits 80 and 81 must each introduce a phase shift of 90° for the required loop phase shift of 360° to be satisfied. Therefore, so long as the loop gain exceeds one, oscillations will automatically be sustained with the circuit phase shifts establishing themselves so as to accomplish the required 360° loop phase shift.

With the above facts in mind, Equation (6) can be simplified even more. When the circuit is oscillating, the phase shift $\theta$ through each of phase shift circuits 80 and 81 is 90° and the tangent of $\theta/2$ or 45°=1. The frequency $f$ as defined in Equation (7) can then be expressed as a function of the modulating voltage:

$$\text{therefore, } f = \frac{K_4}{R_T(1)} = \frac{K_4 V_T}{K_2} \quad (8)$$

$$\text{therefore, } f = K_5 V_T \left(\text{where } K_5 = \frac{K_4}{K_2} = \text{a constant}\right) \quad (9)$$

Equation (8) indicates that the frequency of oscillation of the frequency modulator circuit has a linear relationship to the modulating voltage so long as the approximation used in obtaining Equation (4) holds.

Because Equation (4) is valid for large changes of Thyrite resistance, the frequency modulator provides relatively large linear changes in oscillation frequency in accordance with changes in modulating voltage.

Referring to FIG. 2, it is observed that the phase shift $\theta$ equals 90° only when $V_R = V_C$, or in other words, when the resistance and reactance in the respective circuit arms are equal. Thus, the frequency of oscillation of the frequency modulator will be that frequency where the reactances of capacitors 106 and 108 are respectively equal to the resistances of Thyrite resistors 110 and 112.

With regard now to the operation of the frequency modulator in FIG. 8, assume that the circuit is oscillating. If the voltage output from modulating source 82 becomes more negative, the conduction in transistors 86 and 90 increases. This results in increases in the voltage drops across Thyrite resistors 110 and 112, respectively, with attendant decreases in their resistance. This action produces an increase in phase shift through each of phase shift circuits 80 and 81. Since the gain of the loop is adjusted to be at least one or greater through the combination of amplifier 100 and variable resistor 104, the frequency of oscillation in the circuit increases to equalize the reactive voltage drops across capacitors 106 and 108 with the decreased resistive voltage drops across Thyrite resistors 110 and 112, respectively. Thus, the new frequency of oscillation is that at which each phase shifter produces a 90° shift with an accompanying loop phase shift of 360°.

It can now be seen that if the voltage output from modulating source 82 increases, the result is an increase in the Thyrite resistances due to the decrease in voltages thereacross. This causes a corresponding lessening of the phase shift through each of phase shift circuits 80 and 81. In response, the frequency of oscillation of the frequency modulator decreases thereby maintaining the required 360° loop phase shift.

As aforestated, circuits 91 and 93 are low Q tuned circuits, that is, their resonance curves are relatively flat over a wide range of frequencies instead of being peaked at a single or small group of frequencies (high Q). Proper design therefore results in their presenting uniformly high impedances to all expected oscillation frequencies. Thus, as in FIGS. 5 and 7, the low frequency modulation voltages appear substantially across the Thyrite resistors whereas the oscillation frequency voltages appear substantially across the tuned circuits. This action prevents the oscillation voltage frequencies from affecting the Thyrite resistance values.

It should be appreciated that only one phase shift circuit could be used in the frequency modulator (instead of the two shown in FIG. 8). This would present certain problems however. One phase shift circuit could accomplish a phase shift $\theta$, but an additional phase shift of $360-\theta$ would have to be introduced into the loop for oscillations to be sustained. For example, if it is assumed that $\theta=90°$, then $360°-\theta=270°$. If an amplifier were used to shift the phase 180° (as is shown in FIG. 8) then the additional phase shift needed in order that the circuit oscillate would be 270°−180°=90°. Networks are available which will provide this phase shift with a substantially constant attenuation at all oscillation frequencies, but they are complex. By utilizing a pair of phase shifters, as in FIG. 8, any requirement for such complex circuitry is eliminated.

While the invention has been particularly shown and described with reference to preferred embodiments thereof, it will be understood by those skilled in the art that the foregoing and other changes in form and details may be made therein without departing from the spirit and scope of the invention.

I claim:

1. In a phase modulator to which there is fed a high frequency carrier signal superimposed upon an amplitude varying modulating signal, the combination comprising:
   a phase splitter having first and second outputs, both said outputs producing said superimposed signals, the signals emanating from said first output phase displaced substantially 180° from the signals emanating from said second output;

variable resistance means connected to said first output, the resistance of said variable resistance means exhibiting an inversely related substantially hyperbolic variation in relation to a variation in the voltage applied thereto;

reactive means connected to said second output for shifting the phase of said superimposed signals emanating from said second output by substantially 90°; and output means connected between said variable resistance means and said reactive means, said output means producing said high frequency carrier signal having phase displacements proportional to amplitude variations of said modulating signal.

2. The invention as recited in claim 1 with the further provision of tuned circuit means connected to said output means, said tuned circuit means exhibiting its highest impedance at the frequency of said carrier signal.

3. A circuit for varying the phase of a carrier signal in accordance with amplitude variations of a modulating signal which includes a source of high frequency carrier signals superimposed upon an amplitude varying modulating signal, the combination comprising:

phase splitting means fed from said source having first and second outputs, both said outputs producing said superimposed signals, the signals emanating from said first output phase displaced substantially 180° from the signals emanating from said second output;

capacitive reactance means connected to said first output for shifting said superimposed signals emanating from said output by substantially 90° in phase;

non-linear resistance means connected to said second output, the resistance of said non-linear resistance means exhibiting an inversely related substantially hyperbolic variation in relation to a voltage applied thereto; and tuned circuit means connected between said non-linear resistance means and said capacitive reactive means, said tuned circuit means exhibiting its highest impedance at the frequency of said carrier signal.

4. In a phase modulator to which there is fed a superimposed signal which includes a high frequency carrier signal superimposed upon an amplitude varying modulating signal V, the combination comprising:

a phase splitter having first and second outputs, both said outputs producing said superimposed signal, the signals emanating from said first output phase displaced substantially 180° from the signals emanating from said second output;

variable resistance means connected to said first output, the resistance R of said resistance means varying in response to amplitude variations of said superimposed signal substantially in accordance with the expression $$R=\frac{K_2}{V}$$

where $K_2$ is a predetermined constant;

reactive means connected to said second output for shifting the phase of said superimposed signals emanating from said second output by substantially 90°; and output means connected between said variable resistance means and said reactive means, said high frequency carrier signal emanating from said output means having a phase displacement $\theta$ expressed by the function $\theta=K_3V$ where $K_3$ is a predetermined constant.

5. In a frequency modulation circuit, the combination comprising:

phase shift means providing a normal phase shift $\theta$, said phase shift means including: a phase splitter having an input adapted to have applied thereto an amplitude varying modulating signal, said phase splitter having in-phase and out-of-phase outputs; non-linear resistance means connected to one of said outputs, said non-linear resistance means exhibiting inversely related substantially hyperbolic variations in resistance in relation to changes in said modulating signal; reactive means connected to another output from said phase splitter, said reactive means being adapted to shift the phase of a signal by substantially 90°; and output means connected between said non-linear resistance means and said reactance means, said phase shift means exhibiting substantially linear changes in said phase shift $\theta$ in accordance with changes in said modulating signal; and means exhibiting a phase shift of $360°-\theta$ connected between said output means and said phase splitter, said means including amplification means; whereby said circuit oscillates at frequencies which are dependent upon variations in amplitude of said modulating signal.

6. The invention as recited in claim 5 wherein said output means comprises a low Q tuned circuit exhibiting substantially constant impedances over the range of frequencies of oscillation of said frequency modulator.

7. In a frequency modulation circuit to which there is applied an amplitude varying modulating signal, the combination comprising:

first and second series connected phase shift means, each said phase shift means providing a normal phase shift, $\theta$, each said phase shift means including: a phase splitter to which said amplitude varying modulating signal is applied, said phase splitter having in-phase and out-of-phase outputs; non-linear resistance means connected to one of said outputs, said non-linear resistance means exhibiting inversely related substantially hyperbolic variations in resistance in relation to changes in said modulating signal; reactive means connected to another output from said phase splitter, said reactive means being adapted to shift the phase of a signal by substantially 90°; and output means connected between said non-linear resistance means and said reactance means, each said phase shift means exhibiting substantially linear changes in said normal phase shift $\theta$ in accordance with changes in said modulating signal; and feedback means exhibiting a constant phase shift of $360°-2\theta$ connected between the output means of said second phase shift means and the phase splitter in said first phase shift means, said feedback means including amplification means; whereby an oscillating circuit is formed whose frequencies of oscillation are dependent upon variations in said modulating signal.

8. The invention as recited in claim 7 wherein said output means comprises a low Q tuned circuit exhibiting substantially constant impedances over the range of frequencies of oscillation of said frequency modulator.

References Cited by the Examiner

UNITED STATES PATENTS

| | | | |
|---|---|---|---|
| 1,950,406 | 3/34 | Hoorn | 332—23 |
| 2,284,401 | 5/42 | Manley et al. | 332—29 X |
| 2,790,147 | 4/57 | Armstrong et al. | 332—23 X |

ROY LAKE, *Primary Examiner.*

ALFRED L. BRODY, *Examiner.*